US012568677B2

(12) United States Patent　　　(10) Patent No.:　US 12,568,677 B2
Liu et al.　　　　　　　　　　　　(45) Date of Patent:　　　Mar. 3, 2026

(54) METHOD OF SELF-ALIGNED DIELECTRIC WALL FORMATION FOR FORKSHEET APPLICATION

(71) Applicant: Tokyo Electron Limited, Tokyo (JP)

(72) Inventors: Eric Chih-Fang Liu, Albany, NY (US); Subhadeep Kal, Albany, NY (US); Kai-Hung Yu, Albany, NY (US); Shihsheng Chang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 359 days.

(21) Appl. No.: 18/178,665

(22) Filed: Mar. 6, 2023

(65) Prior Publication Data

US 2024/0304500 A1　　Sep. 12, 2024

(51) Int. Cl.
*H10D 84/03*　　　(2025.01)
*H10D 64/01*　　　(2025.01)
*H10D 84/01*　　　(2025.01)
*H10D 84/85*　　　(2025.01)

(52) U.S. Cl.
CPC ......... *H10D 84/038* (2025.01); *H10D 64/017* (2025.01); *H10D 84/0167* (2025.01); *H10D 84/0184* (2025.01); *H10D 84/853* (2025.01)

(58) Field of Classification Search
CPC ............. H10D 84/038; H10D 84/0167; H10D 84/853; H10D 84/0151; H10D 84/0188; H10D 30/014; H10D 30/43; H10D 30/6735; H10D 62/121; H10D 62/113
See application file for complete search history.

(56) References Cited

U.S. PATENT DOCUMENTS

2021/0175130　A1 *　6/2021　Chan ..................... H10D 62/121
2021/0210637　A1 *　7/2021　Zhang .................. H10D 30/031
2022/0068725　A1 *　3/2022　Chan .................. H10D 84/0151

* cited by examiner

*Primary Examiner* — Tuan A Hoang
(74) *Attorney, Agent, or Firm* — Oblon, McClelland, Maier & Neustadt, L.L.P.

(57) ABSTRACT

Aspects of the present disclosure provide a method for fabricating a forksheet semiconductor structure. For example, the method can include forming on a substrate a multi-layer stack including first and second semiconductor layers stacked over one another alternately, forming a cap layer over the multi-layer stack, forming a mandrel structure from the multi-layer stack and the cap layer, forming a fill material that surrounds the mandrel structure and has a top surface level with a top of the mandrel structure, partially recessing the cap layer to uncover opposite inner sidewalls of the fill material, forming sidewall spacers on the opposite inner sidewalls, directionally etching the multi-layer stack to define an insulation wall trench using the sidewall spacers as an etch mask, and forming an insulation material within the insulation wall trench to form an insulation wall that separates the multi-layer stack into insulated first and second multi-layer stacks.

17 Claims, 15 Drawing Sheets

METHOD OF SELF-ALIGNED DIELECTRIC WALL FORMATION FOR FORKSHEET APPLICATION

FIELD OF THE INVENTION

This disclosure relates to microelectronic devices including semiconductor devices, transistors, and integrated circuits, including methods of microfabrication.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Aspects of the present disclosure provide a method for fabricating a forksheet semiconductor structure. For example, the method can include forming a multi-layer stack on a substrate for a forksheet semiconductor structure, the multi-layer stack including first semiconductor layers and second semiconductor layers that are stacked over one another alternately. The method can also include forming a cap layer over the multi-layer stack, forming a mandrel structure from the multi-layer stack and the cap layer, forming a fill material that surrounds the mandrel structure and has a top surface level with a top of the mandrel structure so that the cap layer of the mandrel structure is uncovered, partially recessing the cap layer of the mandrel structure relative to the top surface of the fill material to uncover opposite inner sidewalls of the fill material, forming first sidewall spacers on the uncovered opposite inner sidewalls of the fill material, directionally etching the multi-layer stack of the mandrel structure to define an insulation wall trench using the first sidewall spacers as an etch mask to separate the multi-layer stack of the mandrel structure into a first multi-layer stack and a second multi-layer stack that are separated by the insulation wall trench, and forming an insulation material within the insulation wall trench to form an insulation wall that insulates the first multi-layer stack and the second multi-layer stack from each other.

In an embodiment, the cap layer can include a first cap layer and a second cap layer formed over the first cap layer, the first cap layer and the second cap layer having different etch selectivities. For example, the first cap layer can be a first hardmask layer, and the second cap layer can be a second hardmask layer. As another example, the cap layer is partially recessed by removing the second hardmask layer while leaving the first hardmask layer over the multi-layer stack of the mandrel structure.

In an embodiment, the first sidewall spacers can be formed by a selective deposition of a spacer material that is deposited on the uncovered opposite inner sidewalls of the fill material without being deposited on the partially recessed cap layer. For example, the selective deposition can include atomic layer deposition (ALD) of titanium nitride (TiN) on the uncovered opposite inner sidewalls of the fill material without being deposited on the partially recessed cap layer. As another example, the fill material can contain carbon.

In an embodiment, the method can also include forming second sidewall spacers each on a corresponding one of the first sidewall spacers such that both the first sidewall spacers and the second sidewall spacers are used as the etch mask when directionally etching the multi-layer stack of the mandrel structure to define the insulation wall trench. For example, the first sidewall spacers and the second sidewall spacers can be formed by conformally depositing a first spacer material on the partially recessed cap layer and the top surface and the inner sidewalls of the fill material, conformally depositing a second spacer material on the first spacer material, directionally etching the second spacer material until uncovering the first spacer material, and directionally etching the first spacer material until uncovering the partially recessed cap layer. As another example, the first sidewall spacers and the second sidewall spacers can be formed by conformally depositing a first spacer material on the partially recessed cap layer and the top surface and the inner sidewalls of the fill material, directionally etching a portion of the first spacer material until uncovering the partially recessed cap layer, conformally depositing a second spacer material on the first spacer material and the partially recessed cap layer, and directionally etching the second spacer material until uncovering the partially recessed cap layer.

In an embodiment, the first sidewall spacers can be formed by conformally depositing a spacer material on the partially recessed cap layer and the top surface and the inner sidewalls of the fill material, and directionally etching and removing a portion of the spacer material that is deposited on the partially recessed cap layer and the top surface of the fill material. For example, the method can further include forming a filler over the spacer material, forming a hardmask over the filler, and patterning the hardmask to define an opening corresponding to a portion of the first sidewall spacers that is deposited over the partially recessed cap layer, and directionally etching and removing the filler via the hardmask.

In an embodiment, the cap layer can include a dummy gate material, and the cap layer can be partially recessed such that the dummy gate material is partially removed without removing an entire thickness of the dummy gate material.

In an embodiment, the method can further include removing the first sidewall spacers, and removing the cap layer. For example, the insulation material can be formed within the insulation wall trench before the cap layer and the first sidewall spacers are removed. As another example, the insulation material can be formed within the insulation wall trench after the first sidewall spacers are removed and before the cap layer is removed. As yet another example, the insulation material can be formed within the insulation wall trench after the cap layer and the first sidewall spacers are removed.

In an embodiment, the method can further include recessing the first semiconductor layers of the multi-layer stack so that sidewalls of the first semiconductor layers of the multi-layer stack are recessed, and forming inner spacers on the recessed sidewalls of the first semiconductor layers of the multi-layer stack. In another embodiment, the method can further include recessing the first semiconductor layers of the first and second multi-layer stacks so that sidewalls of the first semiconductor layers of the first and second multi-layer stacks are recessed, and forming inner spacers on the recessed sidewalls of the first semiconductor layers of the first and second multi-layer stacks. In some embodiments, the method can further include removing and replacing the inner spacers and the first semiconductor layers of the first and second multi-layer stacks with a gate structure.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Integrated circuits (ICs) evolve continuously in order to keep pace with Moore's Law. For example, IC architectures have been evolved from planar MOSFETs, to FinFETs, and to stacked nanosheet FETs, to maintain the Moore's Law scaling path. In nanosheet FETs, a distance between stacked N-type FETs and stacked P-type FETs, i.e., N-P spacing, defines the channel width (or NS width) and therefore the driving current. Specifically, the wider the N-P spacing is, the smaller the channel and the driving current become. To minimize the N-P spacing, forksheet architectures are proposed. In forksheet FETs, a dielectric wall, e.g., a silicon nitride wall, is filled in a trench between stacked N-type FETs and stacked P-type FETs to serve as an insulator.

In fabrication of forksheet FETs, a multi-layer stack can be provided on a substrate. The multi-layer stack can include first semiconductor layers and second semiconductor layers that are stacked over one another alternately. Then, a dielectric wall trench can be formed through the multi-layer stack until uncovering the substrate to separate the multi-layer stack into a first multi-layer stack and a second multi-layer stack that can be used to form N-type semiconductor devices and P-type semiconductor devices, respectively. For example, a resist layer can be formed and patterned to define a hole, and transferred to a hardmask formed over the multi-layer stack, and the multi-layer stack can be etched to form a dielectric wall trench through the multi-layer stack. However, the dielectric wall trench may be not located in a middle region of the multi-layer stack, due to the misalignment of the hardmask with the multi-layer stack. As a result, the separated first and second multi-layer stacks and therefore the N-type FETs and P-type FETs to be formed therefrom have different channel widths.

Figures 1, 2, 3:
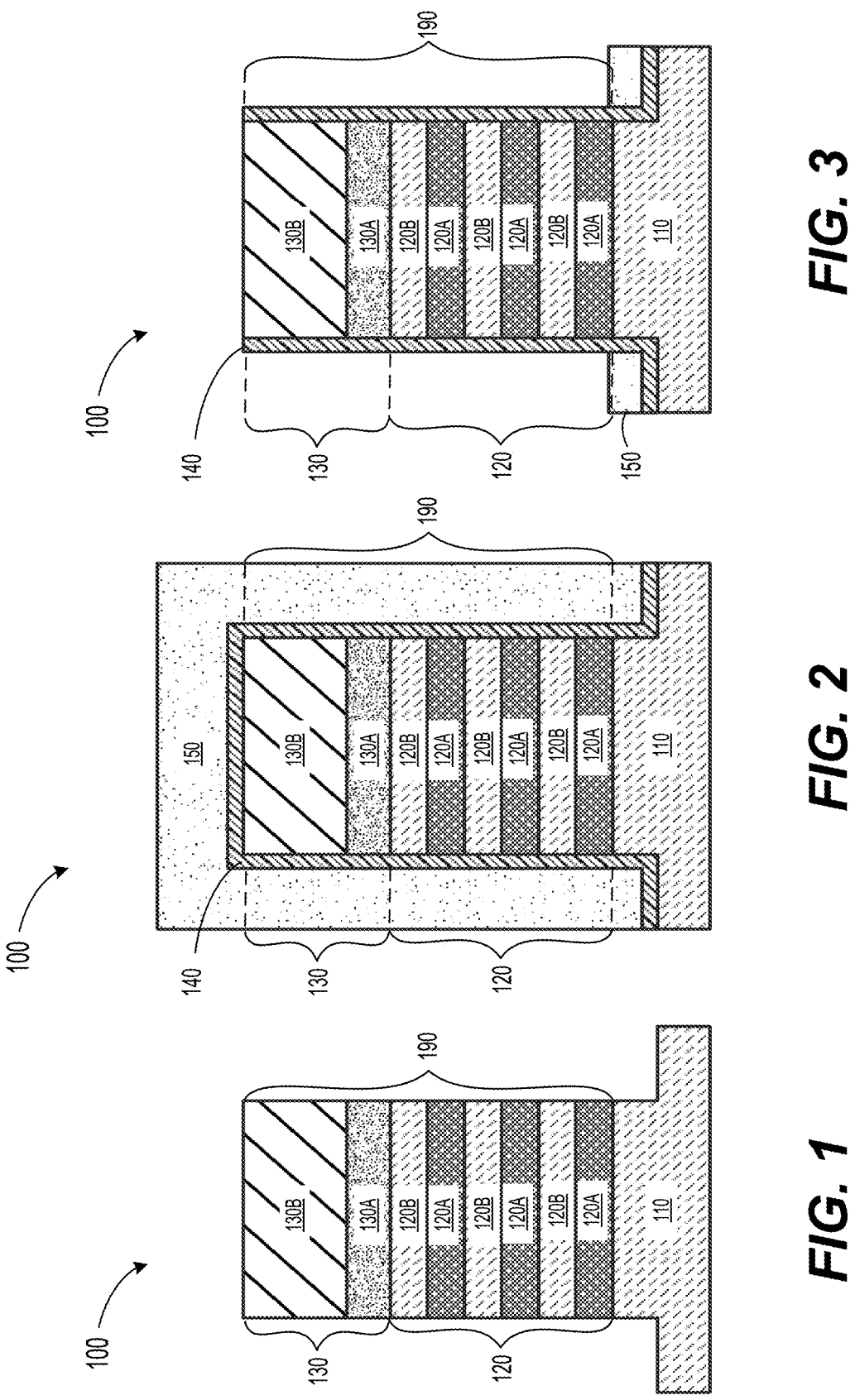
FIGS. 1-9 are schematic diagrams illustrating various intermediary steps of an exemplary method for fabricating a first exemplary forksheet semiconductor structure according to the some embodiments of the present disclosure.

FIGS. 1-9 are schematic diagrams illustrating various intermediary steps of an exemplary method for fabricating a forksheet semiconductor structure 100 according to the some embodiments of the present disclosure. As shown in FIG. 1, a multi-layer stack 120 can be formed on a substrate 110 for forming nano-FETs. The multi-layer stack 120 can be used to form nano-FETs. The substrate 100 can include a semiconductor substrate such as a bulk semiconductor substrate, a semiconductor-on-insulator (SOI) substrate, etc., which can be doped, e.g., with an N-type dopant or a P-type dopant, or undoped. The multi-layer stack 120 can include first semiconductor layers 120A and second semiconductor layers 120B that are stacked over one another alternately. In an embodiment, the second semiconductor layers 120B can be used to form channel regions for the nano-FETs, and the first semiconductor layers 120A can be sacrificial layers (or dummy layers), which will be removed in subsequent processing to expose the top and bottom surfaces of the second semiconductor layers 120B. For example, the first semiconductor layers 120A can be formed of a first semiconductor material, e.g., silicon germanium, and the second semiconductor layers 120B can be formed of a second semiconductor material, e.g., silicon, that is suitable for both N-type FETs and P-type FETs and is etched selectively with respect to the first semiconductor material. As another example, the first semiconductor layers 120A can be formed of a dielectric material, and the second semiconductor layers 120B can be formed of a semiconductor device. In an embodiment, the second semiconductor layers 120B can be thicker than the first semiconductor layers 120A. In some embodiments, the first semiconductor layers 120A and the second semiconductor layer 120B of the multi-layer stack 120 can be grown by vapor phase epitaxy (VPE) or molecular beam epitaxy (MBE), or deposited by chemical vapor deposition (CVD) or atomic layer deposition (ALD).

In an embodiment, the multi-layer stack 120 can be etched, e.g., by reactive ion etch (RIE), neural beam etch (NBE), the like, or a combination thereof, to form fin structures. In an embodiment, the multi-layer stack 120 can be etched with a cap layer (e.g., a hardmask layer) 130 that have a pattern of the fin structures. For example, the cap layer 130 can be single-layered. As another example, the cap layer 130 can be multi-layered. As shown in FIG. 1, the cap layer (e.g., the hardmask layer) 130 can be include a first cap layer (e.g., a first hardmask layer) 130A formed over the multi-layer stack 120 and a second cap layer (e.g., a second hardmask layer) 130B formed over the first cap layer 130A. For example, the first cap layer 130A and the second cap layer 130B can include a dielectric material such as silicon oxide, silicon nitride, the like, or a combination thereof, and be deposited or thermally grown over the multi-layer stack 120. In an embodiment, the first cap layer 130A and the second cap layer 130B can be etched selectively with respect to each other. For example, the first cap layer 130A can be formed of silicon oxide, and the second cap layer 130B can be formed of silicon nitride. In an embodiment, the fin structures (i.e., the etched multi-layer stack 120, which may be referred to briefly as multi-layer stack 120 in the following paragraphs) and the cap layer 130 are collectively referred to as a mandrel structure 190.

As shown in FIG. 2, a liner layer 140 can be formed to cover the mandrel structure 190 (including the cap layer 130 and the multi-layer stack 120) and the substrate 110. The liner layer 140 can be formed of a dielectric material such as silicon oxide, silicon nitride, silicon carbonitride, silicon oxycarbide, silicon oxycarbonitride, hafnium oxide, zirconium oxide, zirconium aluminum oxide, or the like, by thermal oxidation or a conformal deposition process such as ALD, CVD, molecular-beam deposition (MBD), physical vapor deposition (PVD), or the like.

Then, an insulation layer 150, e.g., an oxide such as silicon oxide, a nitride such as silicon nitride, the like, or a combination thereof, can be formed by high-density plasma CVD (HDP-CVD), flowable CVD (FCVD), the like, or a combination thereof, to cover the liner layer 140.

As shown in FIG. 3, the insulation layer 150 can be recessed to reveal the mandrel structure 190 and to form shallow trench isolation (STI) 150. In an embodiment, the top surface of the STI 150 can be above the bottom surface of the fin structures (i.e., the bottom surface of the multi-layer stack 120), as shown in FIG. 3. In another embodiment, the top surface of the STI 150 can be below or coplanar with the bottom surface of the multi-layer stack 120. In an embodiment, power rail contacts can be formed prior to the formation of the STI 150 and below the STI 150.

Figures 4, 5, 6:
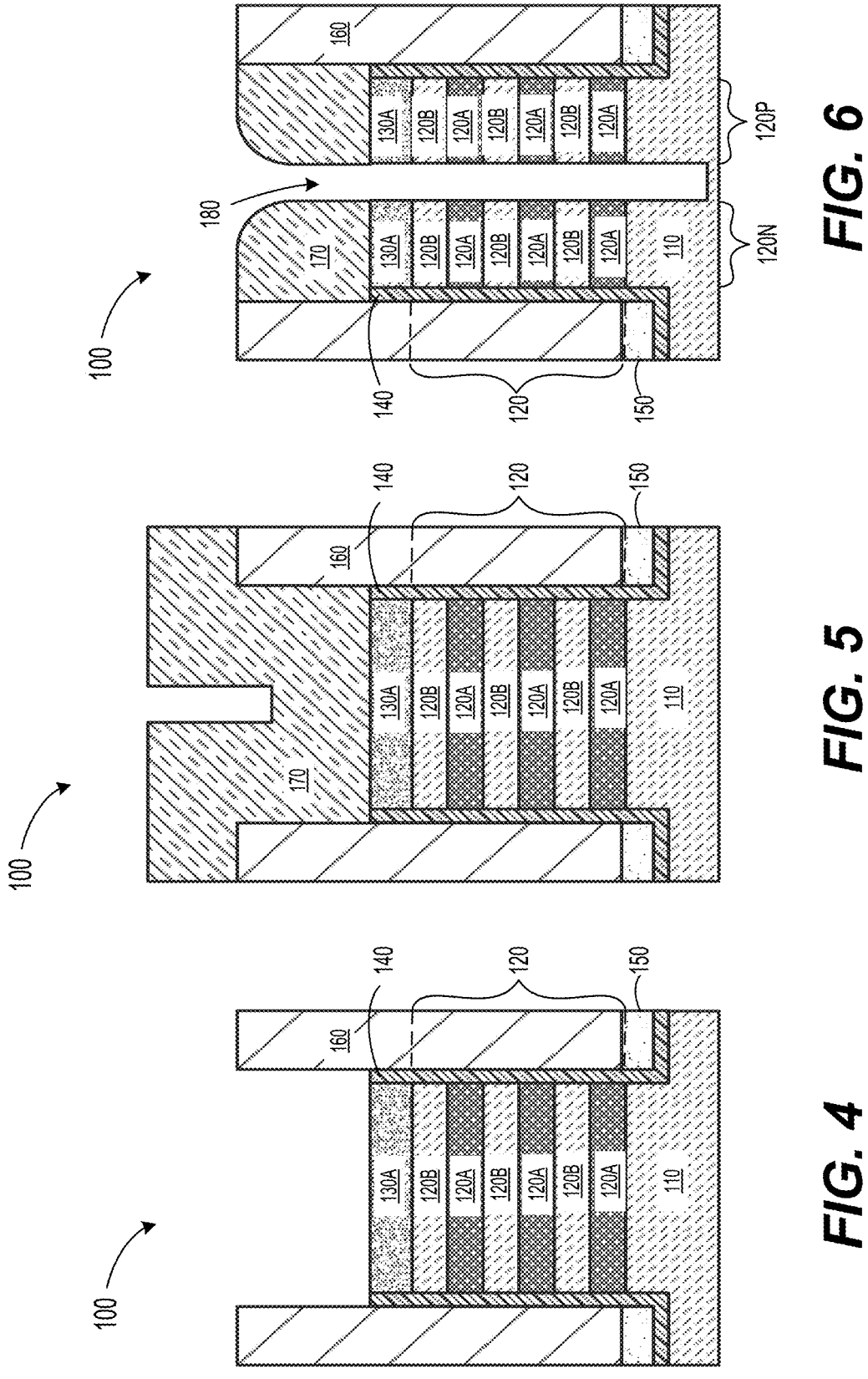

As shown in FIG. 4, a fill material 160 can be formed to surround the mandrel structure 190 (shown in FIG. 3) and has a top surface level with a top of the mandrel structure 190 so that the cap layer 130 (shown in FIG. 3) of the mandrel structure 190 is still uncovered. In an embodiment, the fill material 160, e.g., including carbon, can be spin-coated on vertical outer sidewalls of the liner layer 140 and patterned by electron beam (EB) writing. Then, the cap layer 130 of the mandrel structure 190 can be partially recessed relative to the top surface of the fill material 160 to uncover opposite inner sidewalls of the fill material 160. In an embodiment that the cap layer (or the hardmask layer) 130 is multi-layered and includes the first cap layer (or the first hardmask layer) 130A and the second cap layer (or the second hardmask layer) 130B, as shown in FIG. 3, the second cap layer 130B can be etched and removed while leaving the first cap layer 130A still over the multi-layer stack 120 of the mandrel structure 190.

As shown in FIG. 5, a spacer material 170 can be conformally deposited by ALD, for example, on the partially recessed cap layer 130 (or the first cap layer or the first hardmask layer 130) and the top surface and the uncovered opposite inner sidewalls of the fill material 160. The thickness of the spacer material 170 can be precisely controlled by the ALD. As a result, the spacer material 170 deposited on both the opposite inner sidewalls of the fill material 160 can be equal in thickness.

As shown in FIG. 6, a portion of the spacer material 170 that are deposited above the fill material 160 can be directionally etched and removed to form sidewall spacers 170, which are formed on the uncovered opposite inner sidewalls of the fill material 160. The sidewall spacers 170 can be separated by a distance, a middle point of which is away from the opposite inner sidewalls of the fill material 160 at the same distance. Then, the multi-layer stack 120 (and the partially recessed cap layer, e.g., the first cap layer or the first hardmask layer 130A) of the mandrel structure 190 can be directionally etched to define an insulation wall trench 180 using the sidewall spacers 170 as an etch mask to separate the multi-layer stack 120 of the mandrel structure 190 into a first multi-layer stack 120N and a second multi-layer stack 120P that are separated by the insulation wall trench 180. In an embodiment, the first multi-layer stack 120N and the second multi-layer stack 120P can be used to form a first semiconductor device (e.g., N-type nano-FETs) and a second semiconductor device (e.g., P-type nano-FETs), respectively.

Figures 7, 8, 9:
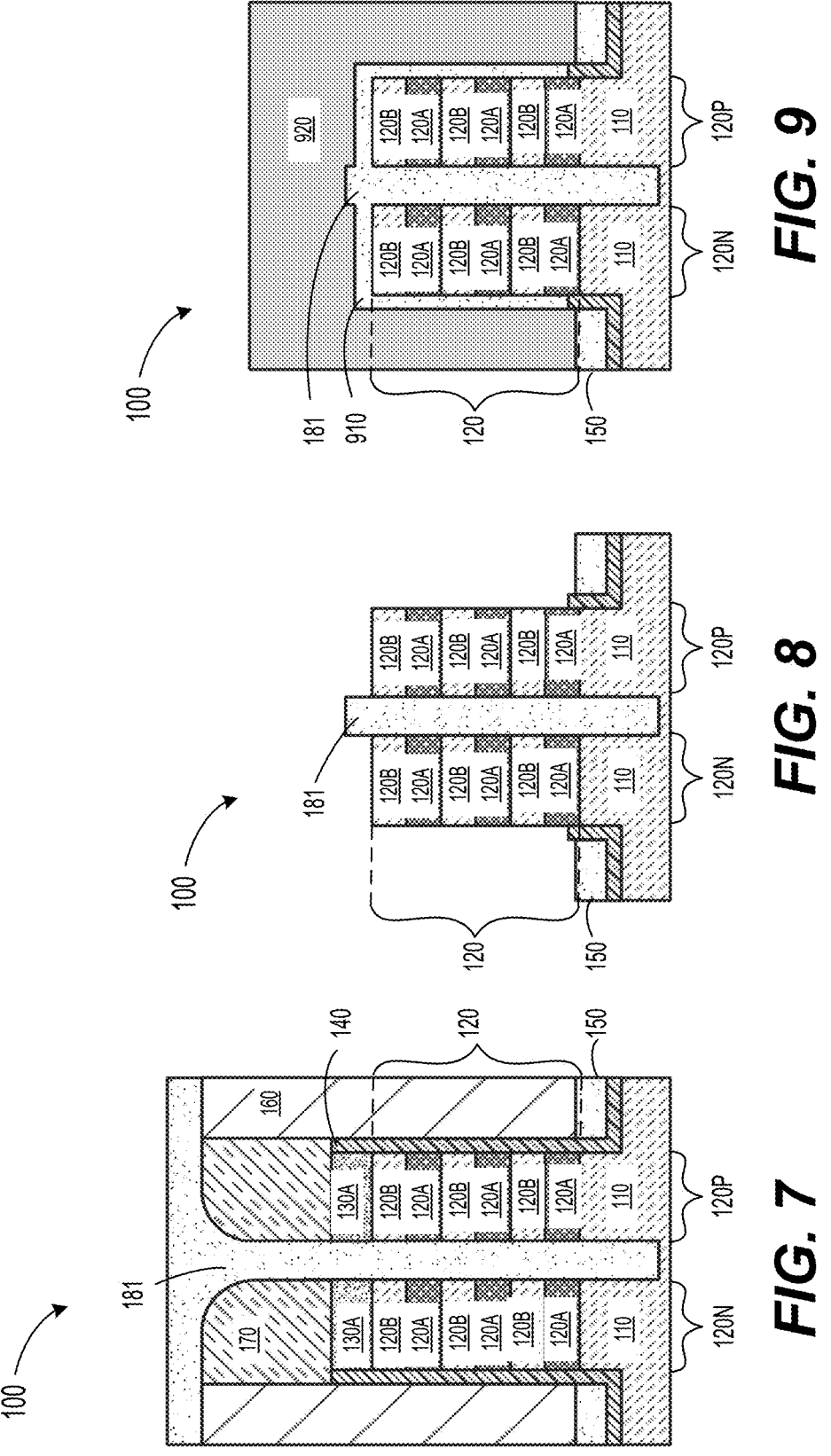

As shown in FIG. 7, an insulating material can be formed within the insulation wall trench 180 (shown in FIG. 6) to form an insulation wall 181 that insulates the first multi-layer stack 120N and the second multi-layer stack 120P from each other. In an embodiment, the insulating material can include a dielectric material such as silicon oxide, silicon nitride, silicon carbonitride, silicon oxycarbide, silicon oxycarbonitride, hafnium oxide, zirconium oxide, zirconium aluminum oxide, or the like, and be formed by a conformal deposition process such as ALD, CVD, MBD, PVD, or the like.

As the sidewall spacers 170 formed on both the opposite inner sidewalls of the fill material 160 can be equal in thickness and be separated by a distance, a middle point of which is away from the opposite inner sidewalls of the fill material 160 at the same distance, the first multi-layer stack 120N and the second multi-layer stack 120P thus formed can also be equal in width, and a critical dimension (CD) of the insulation wall trench 180 and therefore the width of the insulation wall 181 can be precisely controlled and modified by the ALD. The placement error of the insulation (e.g., dielectric) wall in a forksheet semiconductor structure can be improved, and better line edge roughness (LER) control with ALD to reduce the pattern variation of the dielectric wall can be obtained.

As shown in FIG. 8, the fill material 160, the liner layer 140 and the insulation material 181 can be etched back, and the sidewall spacers 170 and the remaining cap layer 130 (e.g., the first cap layer or the first hardmask layer 130A) can be removed, to reveal the first multi-layer stack 120N, the insulation wall 181 and the second multi-layer stack 120P.

In an embodiment, the insulation material can be formed within the insulation wall trench 180 before the remaining cap layer 130 and the sidewall spacers 170 are removed. In another embodiment, insulation material can be formed within the insulation wall trench 180 after the sidewall spacers 170 are removed and before the remaining cap layer 130 is removed. In some embodiments, the insulation material can be formed within the insulation wall trench 180 after the remaining cap layer 130 and the sidewall spacers 170 are removed.

As shown in FIG. 9, the first multi-layer stack 120N and the second multi-layer stack 120P can be further processed to fabricate a first semiconductor device (e.g., N-type nano-FETs) and a second semiconductor device (e.g., P-type nano-FETs), respectively.

For example, a channel spacer 910 can be formed to cover the sidewalls of the revealed first multi-layer stack 120N and second multi-layer stack 120P, and a dielectric layer 920 can be formed over the STI 150, the first multi-layer stack 120N, the second multi-layer stack 120P and the insulation wall 181, as shown in FIG. 9. A portion of the dielectric layer 920 that is formed over the first multi-layer stack 120N, the second multi-layer stack 120P and the insulation wall 181 can be removed, and a dummy dielectric layer and a dummy gate material can be formed over the first multi-layer stack 120N, the second multi-layer stack 120P and the insulation wall 181 sequentially. Source/drain trenches can be formed to uncover the sidewalls of the first multi-layer stack 120N and the second multi-layer stack 120P. Optionally, portions of the sidewalls of the first semiconductor layers 120A of the first multi-layer stack 120N and the second multi-layer stack 120P (which can be sacrificial layers or dummy layers, and will be removed in subsequent processing to expose the top and bottom surfaces of the second semiconductor layers 120B) can be etched and recessed by a wet etch using tetramethylammonium hydroxide (TMAH), ammonium hydroxide (NH$_4$OH), or the like, or by a dry etch using a fluorine-based gas such as hydrogen fluoride (HF) gas, and inner spacers such as a low-k dielectric material can be formed on the recessed sidewalls of the first semiconductor layers 120A. The first multi-layer stack 120N can be masked, and epitaxial source/drain regions of the P-type nano-FETs can be epitaxially grown in the source/drain trenches in the second multi-layer stack 120P. Then, the second multi-layer stack 120P can be masked, and epitaxial source/drain regions of the N-type nano-FETs can be epitaxially grown in the source/drain trenches in the first multi-layer stack 120N. The dummy gate material, the dummy dielectric layer and the first semiconductor layers 120A can be removed and replaced with a gate structure, which may include a gate dielectric layer and a gate electrode formed on the gate dielectric layer.

FIGS. 10-15 are schematic diagrams illustrating various intermediary steps of an exemplary method for fabricating a forksheet semiconductor structure 1000 according to the some embodiments of the present disclosure. The forksheet semiconductor structure 1000 differs from the forksheet semiconductor structure 100 in that the forksheet semiconductor structure 1000 further includes a mandrel structure 1090 that is wider than the mandrel structure 190. The method for fabricating the forksheet semiconductor structure 1000 can be compatible with nanosheet process flow, and the forksheet semiconductor structure 1000 can coexist with a nanosheet semiconductor structure on a single system on chip (SoC).

Figures 10, 11:
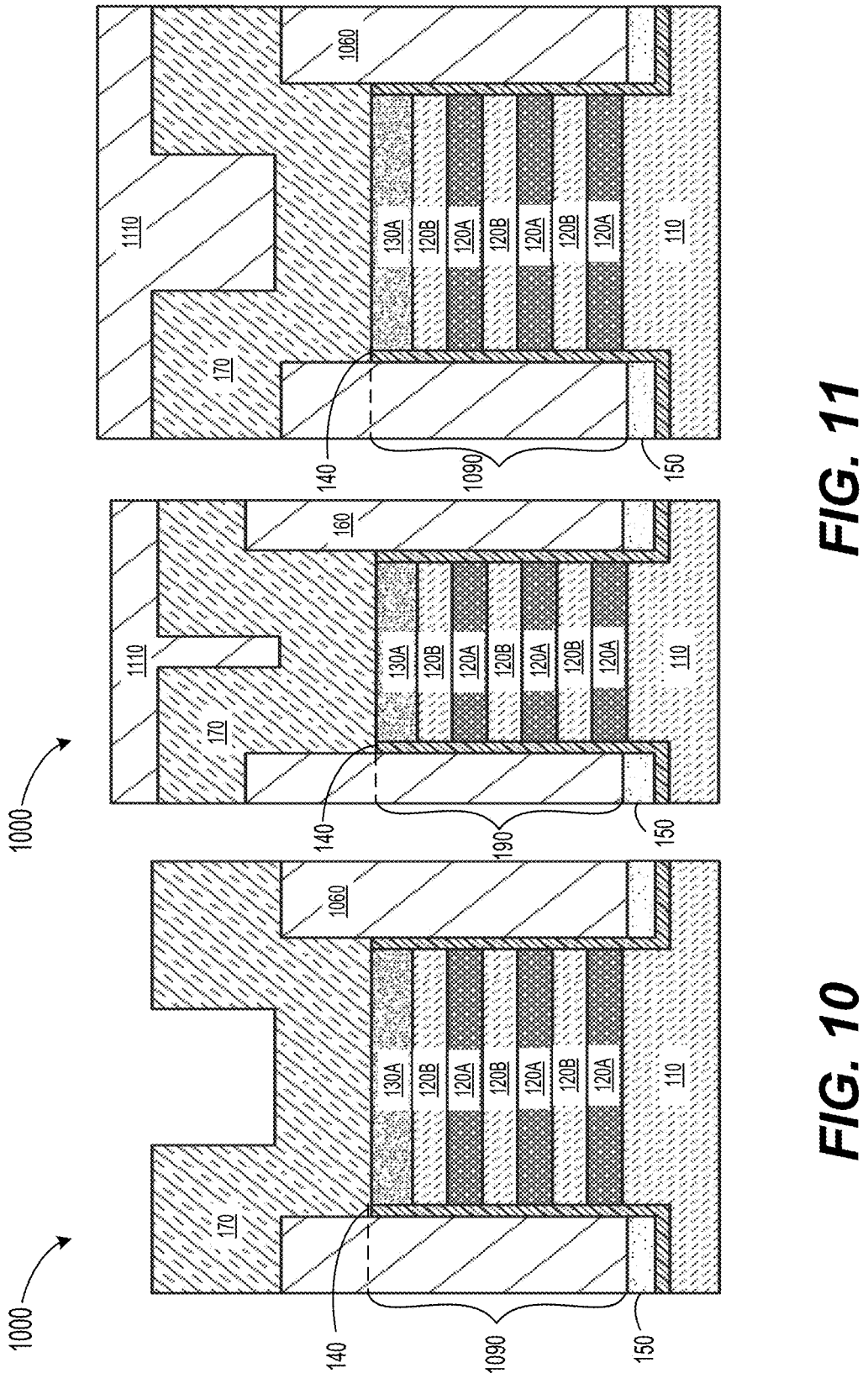
FIGS. 10-15 are schematic diagrams illustrating various intermediary steps of an exemplary method for fabricating a second exemplary forksheet semiconductor structure according to the some embodiments of the present disclosure.

As shown in FIG. 10, a fill material 1060 can be formed (or the fill material 160 can be further formed) to surround the mandrel structure 1090 and has a top surface level with a top of the mandrel structure 1090 so that the cap layer 130 (shown in FIG. 3) of the mandrel structure 1090 is uncovered. Then, the cap layer 130 of the mandrel structure 1090 can be partially recessed. For example, the second cap layer 130B can be etched and removed while leaving the first cap layer 130A still over the multi-layer stack 120 of the mandrel structure 1090. The spacer material 170, when being conformally deposited by ALD, for example, on the partially recessed cap layer 130 (or the first cap layer or the first hardmask layer 130) of the mandrel structure 190 and the top surface and the uncovered opposite inner sidewalls of the fill material 160, can also be conformally deposited on the partially recessed cap layer 130 (or the first cap layer or the first hardmask layer 130) of the mandrel structure 1090 and the top surface and the uncovered opposite inner sidewalls of the fill material 1060.

As the mandrel structure 1090 is wider than the mandrel structure 190, a distance between the spacer material 170 deposited on the opposite inner sidewalls of the fill material 1060 is longer than a distance between the spacer material 170 deposited on the opposite inner sidewalls of the fill material 160. As shown in FIG. 11, a filler (e.g., a dielectric layer) 1110 can be formed over the spacer material 170 that is deposited on the multi-layer stacks 120 of the mandrel structures 190 and 1090.

Figures 12, 13:
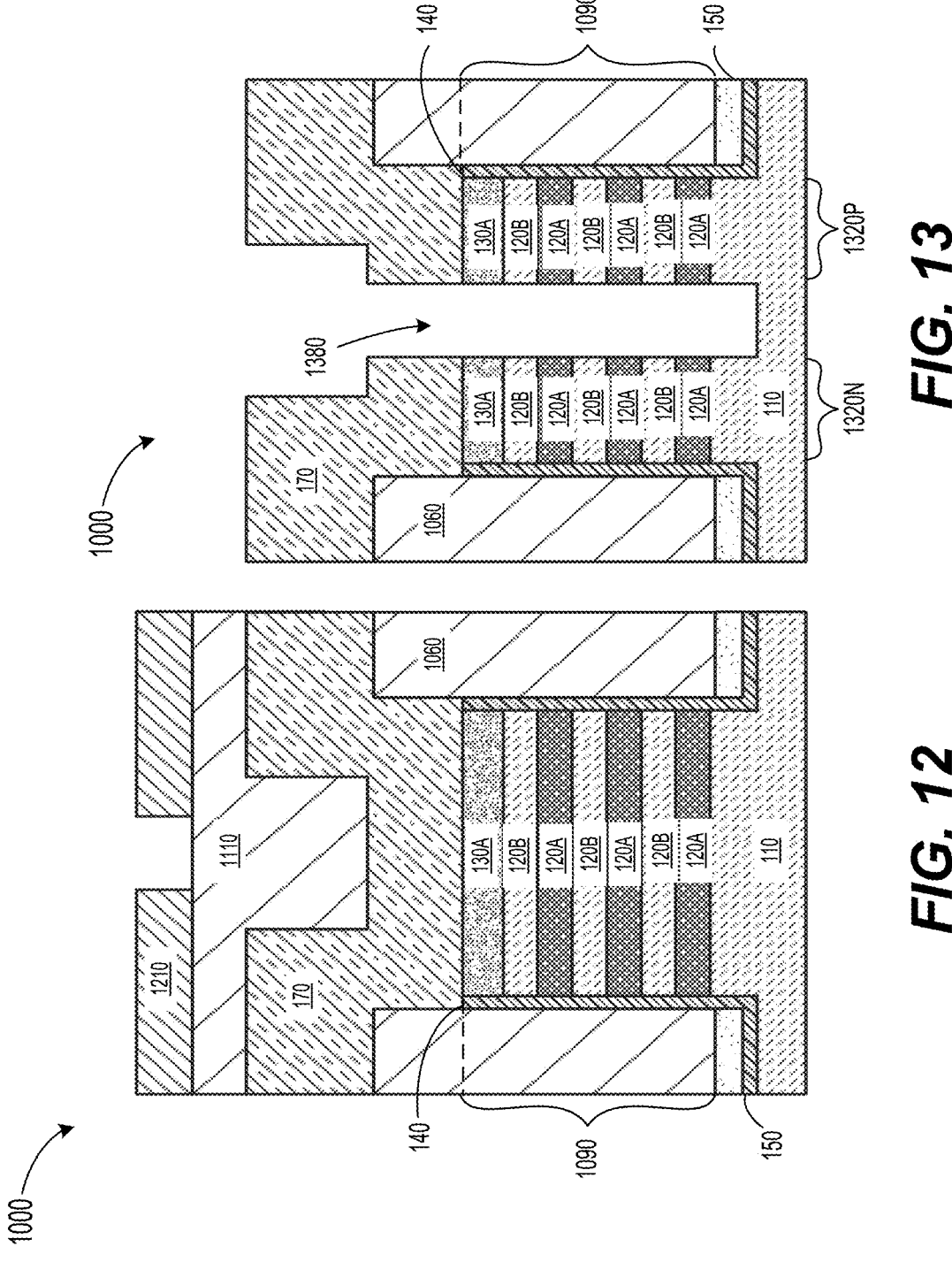

As shown in FIG. 12, an etch mask 1210 can be formed over the dielectric layer 1110 that is deposited over the mandrel structure 1090, and be patterned to define an opening. In an embodiment, the opening can be smaller than the distance between the spacer material 170 deposited on the opposite inner sidewalls of the fill material 1060.

As shown in FIG. 13, the dielectric layer 1110 and the multi-layer stack 120 of the mandrel structure 1090 can be directionally etched and removed to define an insulation wall trench 1380 using the etch mask 1210 as a primary etch mask and the spacer material 170 deposited on the opposite inner sidewalls of the fill material 1060 as a secondary etch mask to separate the multi-layer stack 120 of the mandrel structure 1090 into a first multi-layer stack 1320N and a second multi-layer stack 1320P that are separated by the insulation wall trench 1380.

Figures 14, 15:
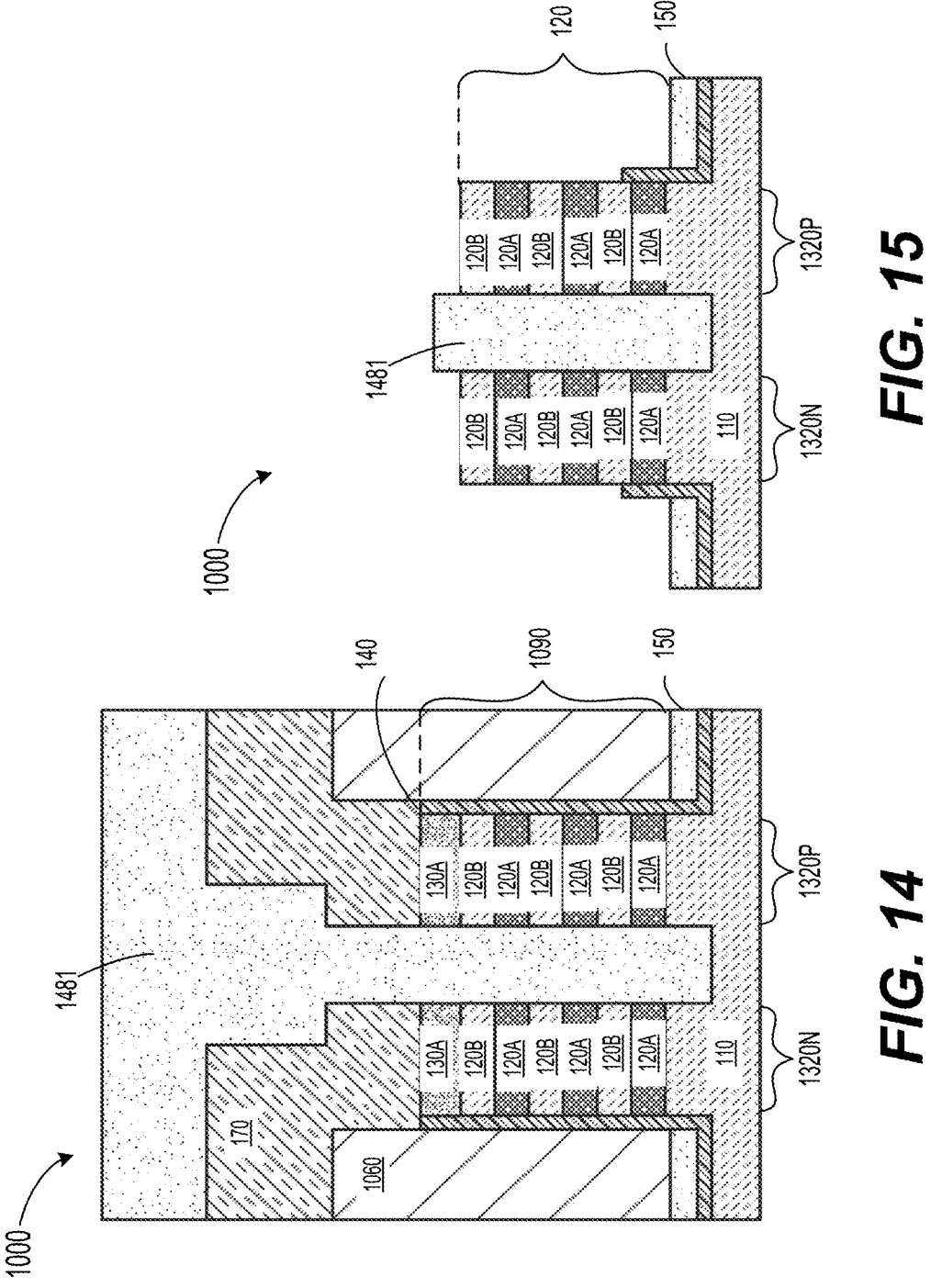

As shown in FIG. 14, the insulating material, which forms the insulation wall 181, can also be formed within the insulation wall trench 1380 (shown in FIG. 13) to form an insulation wall 1481 that insulates the first multi-layer stack 1320N and the second multi-layer stack 1320P from each other.

As shown in FIG. 15, the fill material 1060, the liner layer 140 and the insulation material 1481 can be etched back, and the spacer material 170 and the remaining cap layer 130 (e.g., the first cap layer or the first hardmask layer 130A) can be removed. In an embodiment, the first multi-layer stack 120N and the second multi-layer stack 120P of the mandrel structure 1090 can be further processed to fabricate a first semiconductor device (e.g., N-type nano-FETs) and a second semiconductor device (e.g., P-type nano-FETs), respectively.

FIGS. 16-20 are schematic diagrams illustrating various intermediary steps of an exemplary method for fabricating a forksheet semiconductor structure 1600 according to the some embodiments of the present disclosure. The forksheet semiconductor structure 1600 differs from the forksheet semiconductor structure 1000 in that in the forksheet semiconductor structure 1600 an insulation wall is formed through a double-ALD process.

Figures 16, 17, 18:
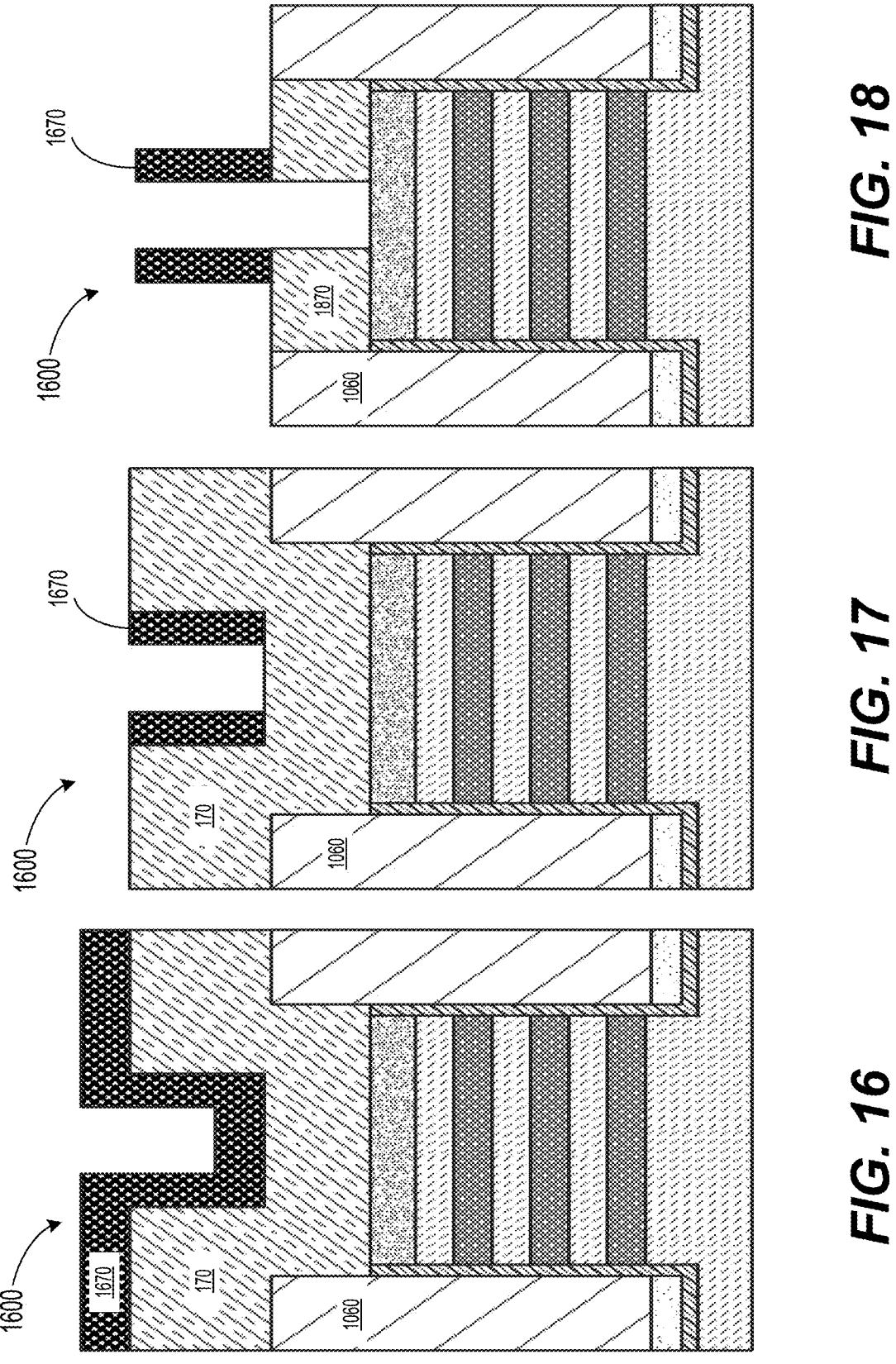
FIGS. 16-20 are schematic diagrams illustrating various intermediary steps of an exemplary method for fabricating a third exemplary forksheet semiconductor structure according to the some embodiments of the present disclosure.

As shown in FIG. 16, which follows FIG. 10, after the spacer material 170 is conformally deposited, an additional spacer material 1670 can be further conformally deposited by ALD, for example, on the spacer material 170.

As shown in FIG. 17, a portion of the spacer material 1670 can be directionally etched until uncovering the top surface of the spacer material 170.

As shown in FIG. 18, a portion of the spacer material 170 that is deposited on the partially recessed cap layer 130 (shown in FIG. 3) and the top surface of the fill material 1060 can be directionally etched and removed to form sidewall spacers 1870, which are wider than the sidewall spacers 170 by the thickness of the spacer material 1670.

Figures 19, 20:
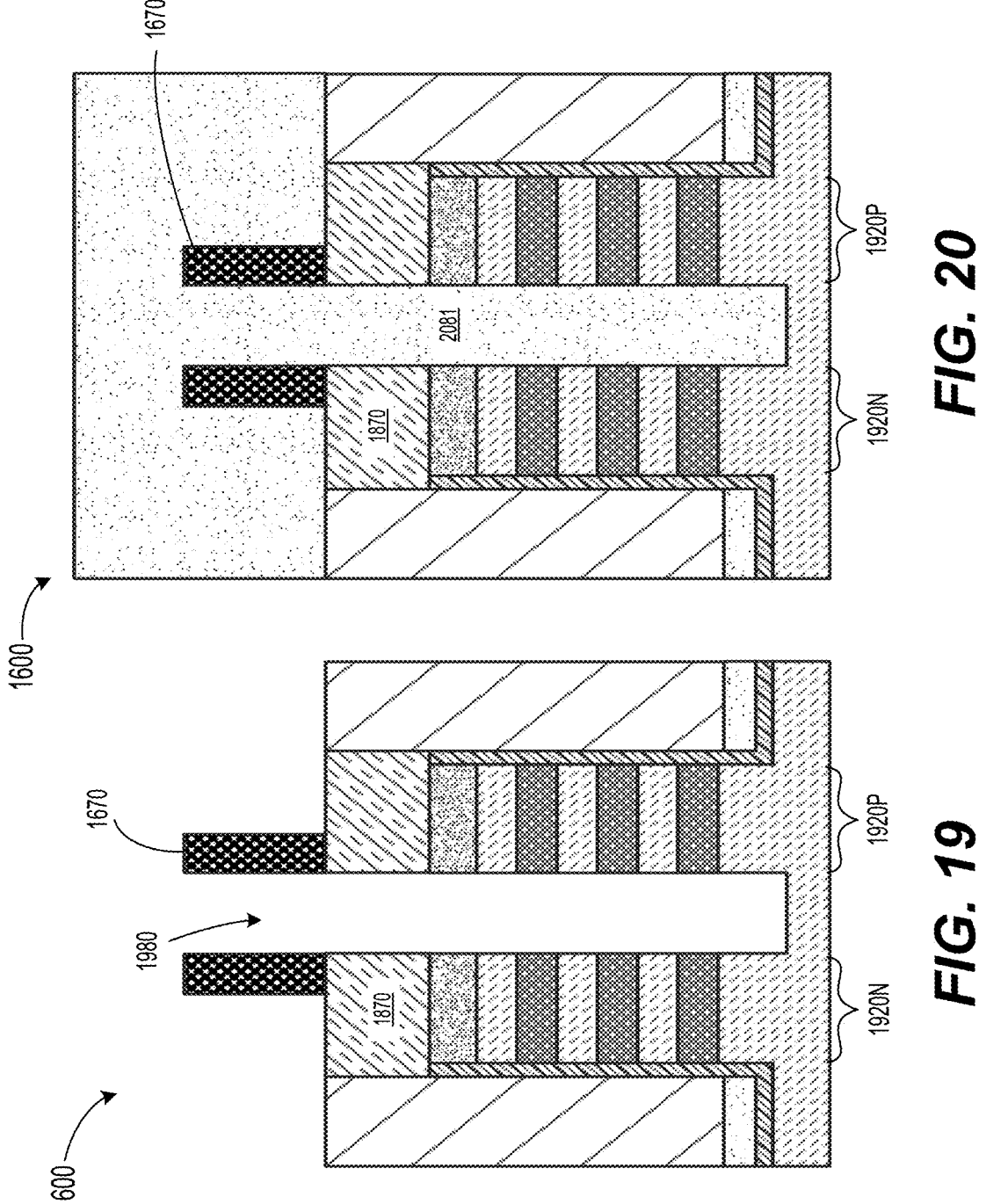

As shown in FIG. 19, the multi-layer stack 120 of the mandrel structure 1090 can be directionally etched and removed to define an insulation wall trench 1980 using the sidewall spacers 1870 as an etch mask to separate the multi-layer stack 120 of the mandrel structure 1090 into a first multi-layer stack 1920N and a second multi-layer stack 1920P that are separated by the insulation wall trench 1980.

As shown in FIG. 20, the insulating material, which forms the insulation wall 181, can also be formed within the insulation wall trench 1980 (shown in FIG. 19) to form an insulation wall 2081 that insulates the first multi-layer stack 1920N and the second multi-layer stack 1920P from each other.

Figures 21, 22:
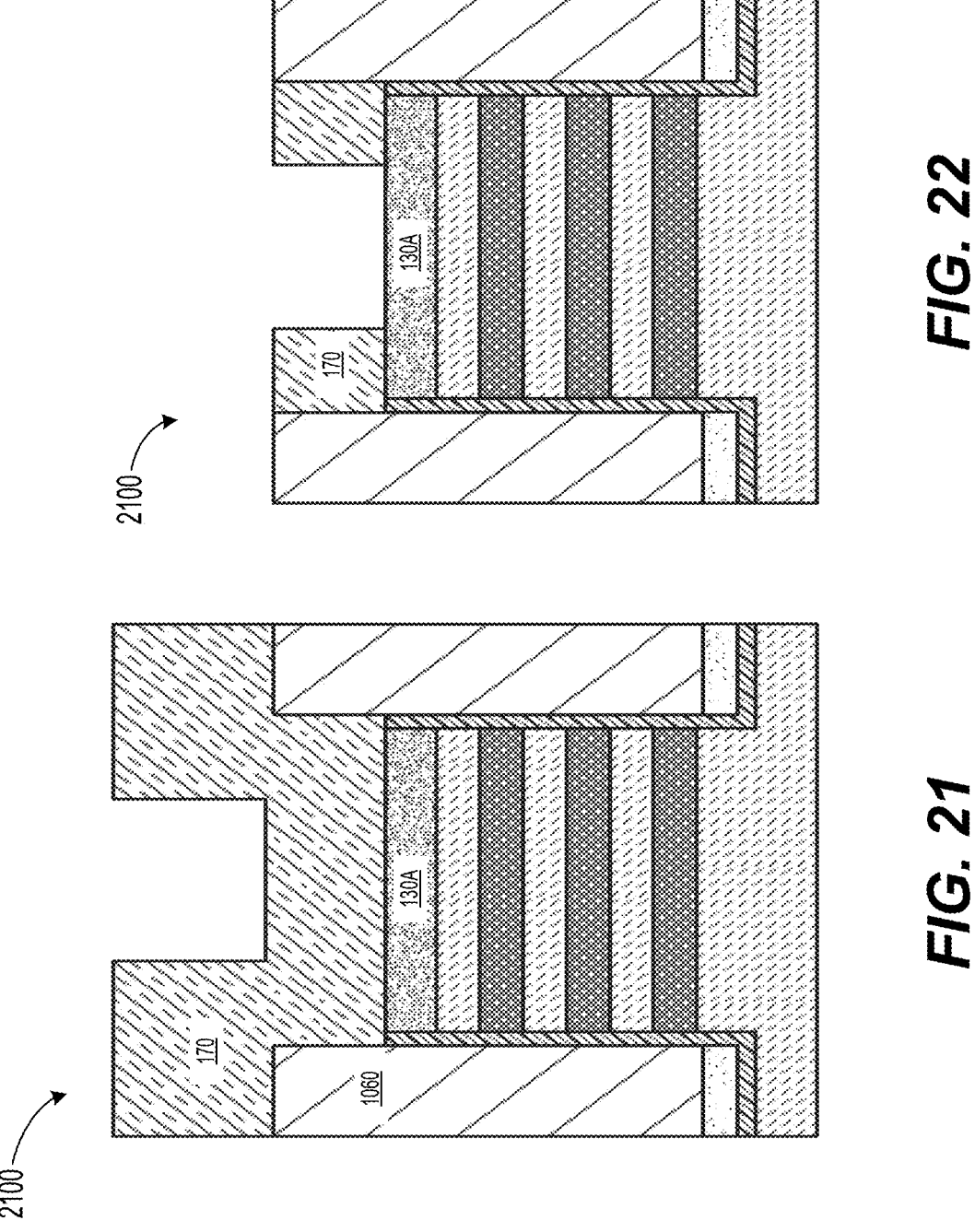
FIGS. 21-26 are schematic diagrams illustrating various intermediary steps of an exemplary method for fabricating a fourth exemplary forksheet semiconductor structure according to the some embodiments of the present disclosure.

FIGS. 21-26 are schematic diagrams illustrating various intermediary steps of an exemplary method for fabricating a forksheet semiconductor structure 2100 according to the some embodiments of the present disclosure. The forksheet semiconductor structure 2100 differs from the forksheet semiconductor structure 1600 in that the sidewall spacers 170 are formed and then a second ALD process is performed. FIG. 21 is similar to FIG. 10.

As shown in FIG. 22, a portion of the spacer material 170 can be directionally etched and removed until uncovering the first cap layer 130A to form the sidewall spacers 170.

Figures 23, 24, 25:
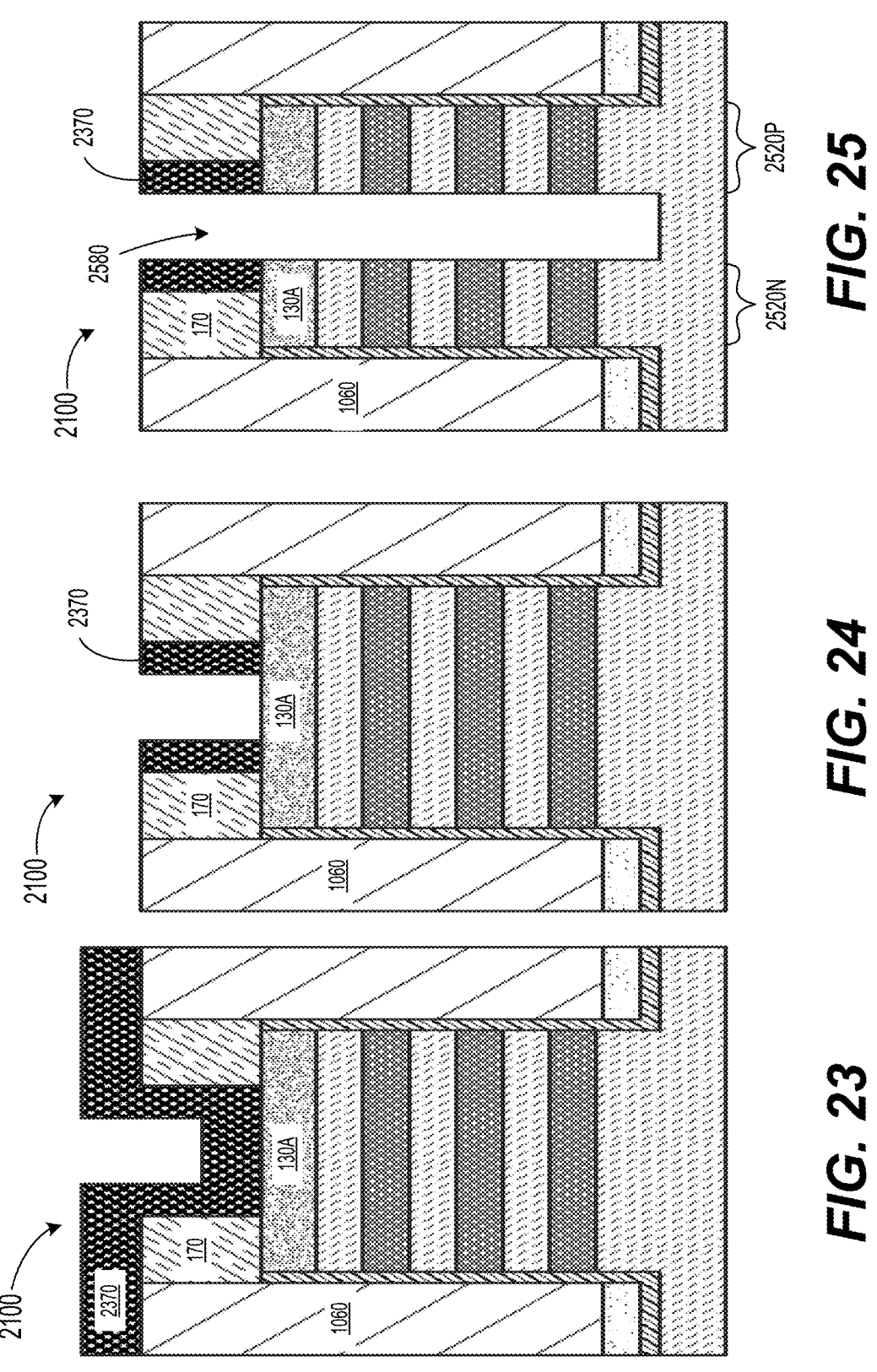

As shown in FIG. 23, a spacer material 2370 can be conformally deposited by ALD, for example, on the top surfaces of the fill material 1060 and the sidewall spacers 170, the uncovered first cap layer 130A, and the opposite inner sidewalls of the sidewall spacers 170.

As shown in FIG. 24, a portion of the spacer material 2370 can be etched and removed until uncovering the top surface of the sidewall spacers 170 to form sidewall spacers 2370.

As shown in FIG. 25, the multi-layer stack 120 of the mandrel structure 1090 (shown in FIG. 10) can be directionally etched to define an insulation wall trench 2580 using the sidewall spacers 170 and the sidewall spacers 2370 as an etch mask to separate the multi-layer stack 120 of the mandrel structure 1090 into a first multi-layer stack 2520N and a second multi-layer stack 2520P that are separated by the insulation wall trench 2580. In an embodiment, the first multi-layer stack 2520N and the second multi-layer stack 2520P can be used to form a first semiconductor device (e.g., N-type nano-FETs) and a second semiconductor device (e.g., P-type nano-FETs), respectively.

Figure 26:
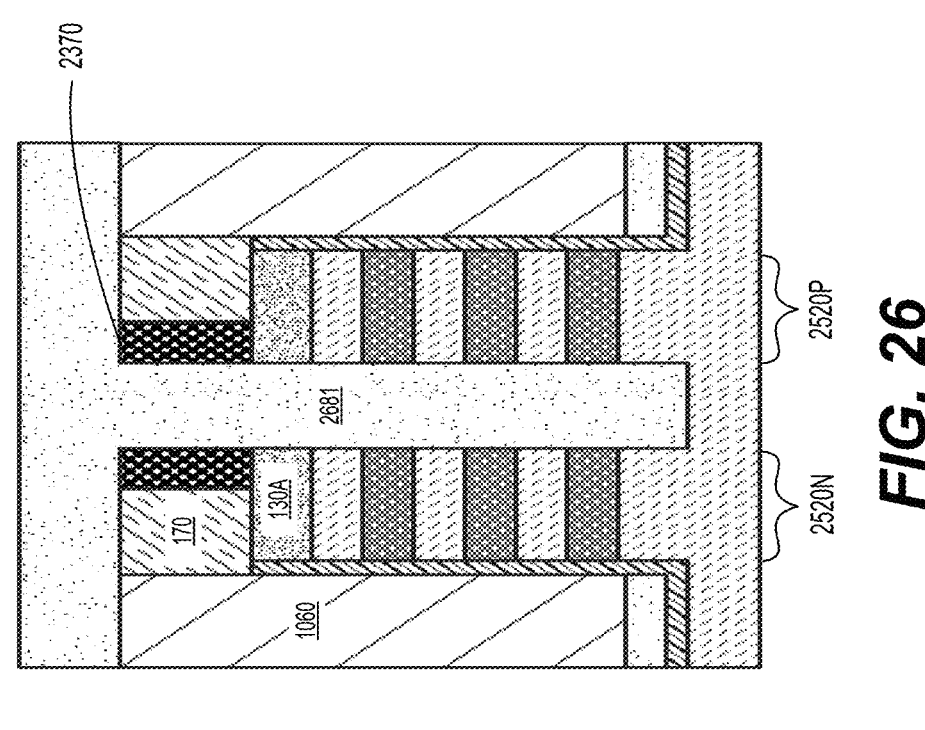

As shown in FIG. 26, the insulating material, which forms the insulation wall 181, can also be formed within the insulation wall trench 2580 (shown in FIG. 25) to form an insulation wall 2681 that insulates the first multi-layer stack 2520N and the second multi-layer stack 2520P from each other.

Figures 27, 28, 29:
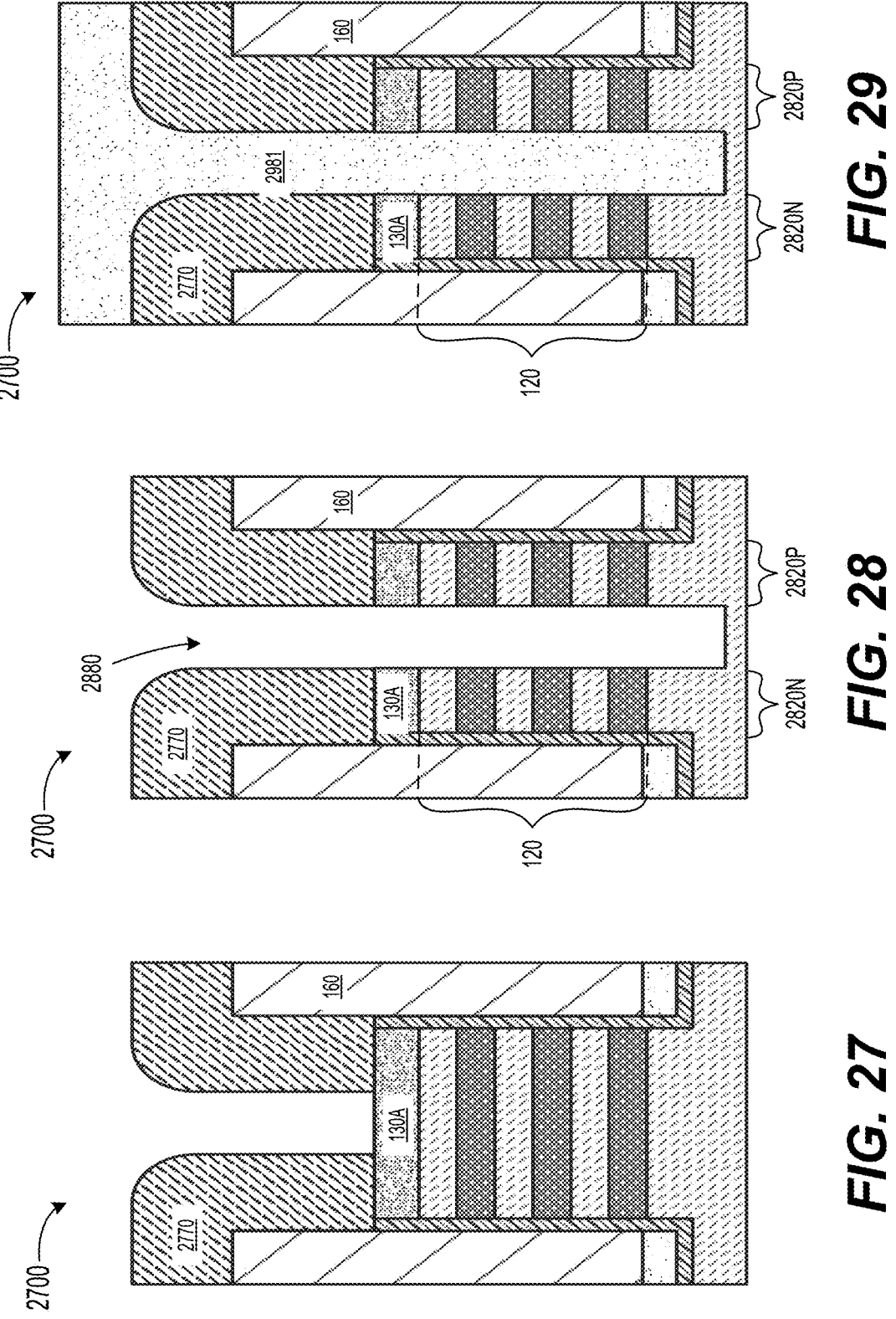
FIGS. 27-29 are schematic diagrams illustrating various intermediary steps of an exemplary method for fabricating a fifth exemplary forksheet semiconductor structure according to the some embodiments of the present disclosure.

FIGS. 27-29 are schematic diagrams illustrating various intermediary steps of an exemplary method for fabricating a forksheet semiconductor structure 2700 according to the some embodiments of the present disclosure. The forksheet semiconductor structure 2700 differs from the forksheet semiconductor structure 100 in that the forksheet semiconductor structure 2700 includes a spacer material 2770 that is not formed on the partially recessed cap layer 130.

As shown in FIG. 27, which follows FIG. 4, the spacer material 2770 can be deposited on the top surface and the uncovered opposite inner sidewalls of the fill material 160 to form sidewall spacers 2770, without being deposited on the partially recessed cap layer 130 (or the first cap layer or the first hardmask layer 130). For example, the first cap layer 130A can include $SiO_2$, and the spacer material 2770 can be deposited by atomic layer deposition (ALD) of titanium nitride (TiN) on the uncovered opposite inner sidewalls of the fill material 160 without being deposited on the first cap layer 130A. In an embodiment, the SiO2 surface can be passivated by inhibition layer prior to TiN deposition. In an embodiment, TiN can be deposited selectively on the surface of the fill material 160 rather than on the first cap layer 130A.

As shown in FIG. 28, the multi-layer stack 120 (and the partially recessed cap layer, e.g., the first cap layer or the first hardmask layer 130A) of the mandrel structure 190 can be directionally etched to define an insulation wall trench 2880 using the sidewall spacers 2770 as an etch mask to separate the multi-layer stack 120 of the mandrel structure 190 into a first multi-layer stack 2820N and a second multi-layer stack 2820P that are separated by the insulation wall trench 2880. As the spacer material 2770 is not deposited on the first cap layer 130A, the step of removing the portion of the spacer material 170 until uncovering the first cap layer 130A, as shown in FIG. 6, can be omitted.

As shown in FIG. 29, an insulating material can be formed within the insulation wall trench 2880 (shown in FIG. 28) to form an insulation wall 2981 that insulates the first multi-layer stack 2820N and the second multi-layer stack 2820P from each other.

FIGS. 30-38 are schematic diagrams illustrating various intermediary steps of an exemplary method for fabricating a forksheet semiconductor structure 3000 according to the some embodiments of the present disclosure. The forksheet semiconductor structure 3000 differs from the forksheet semiconductor structure 100 in that in the forksheet semiconductor structure 3000 an insulation wall is formed after the formation of source/drain trenches and epitaxial source/drain regions.

Figures 30, 31, 32:
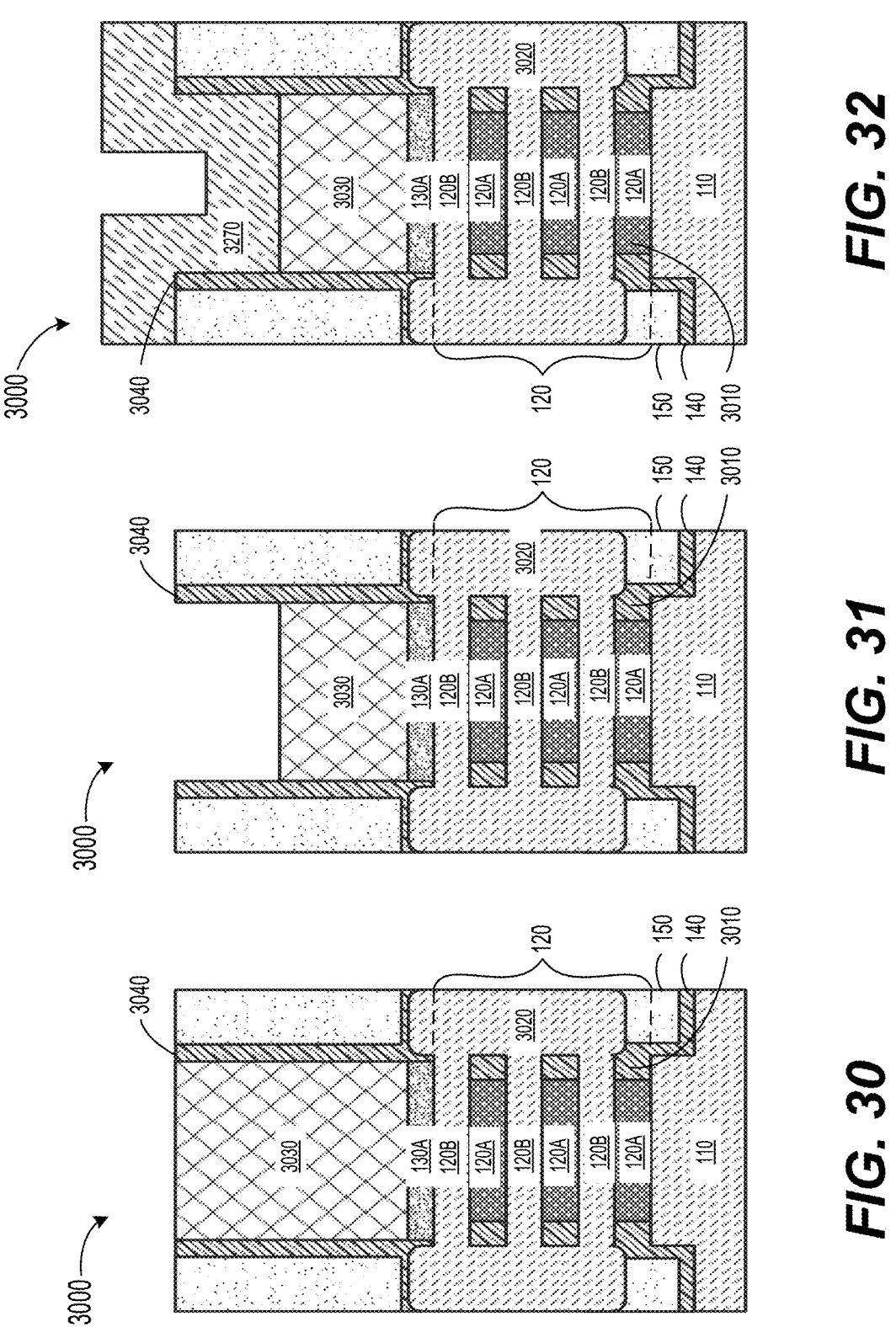
FIGS. 30-38 are schematic diagrams illustrating various intermediary steps of an exemplary method for fabricating a sixth exemplary forksheet semiconductor structure according to the some embodiments of the present disclosure.

As shown in FIG. 30, which follows FIG. 4, source/drain trenches can be formed to uncover the sidewalls of the multi-layer stack 120. Optionally, portions of the sidewalls of the first semiconductor layers 120A of the multi-layer stack 120 (which can be sacrificial layers or dummy layers, and will be removed in subsequent processing to expose the top and bottom surfaces of the second semiconductor layers 120B) can be etched and recessed, and inner spacers 3010 such as a low-k dielectric material can be formed on the recessed sidewalls of the first semiconductor layers 120A. Then, epitaxial source/drain regions 3020 of the nano-FETs can be epitaxially grown in the source/drain trenches in the multi-layer stack 120. A dummy gate material 3030 can be formed over the first cap layer 130A and between a liner layer 3040.

As shown in FIG. 31, the dummy gate material 3030 can be partially recessed such that an entire thickness of the dummy gate material 3030 is not removed, to uncover opposite inner sidewalls of the liner layer 3040.

As shown in FIG. 32, a spacer material 3270 can be conformally deposited by ALD, for example, on the partially recessed dummy gate material 330 and the top surface and the uncovered opposite inner sidewalls of the liner layer 3040.

As shown in FIG. 6, a portion of the spacer material 3270 that are deposited above the liner layer 3040 can be directionally etched and removed to form sidewall spacers 3270, which are formed on the uncovered opposite inner sidewalls of the liner layer 3040.

Figures 33, 34, 35:
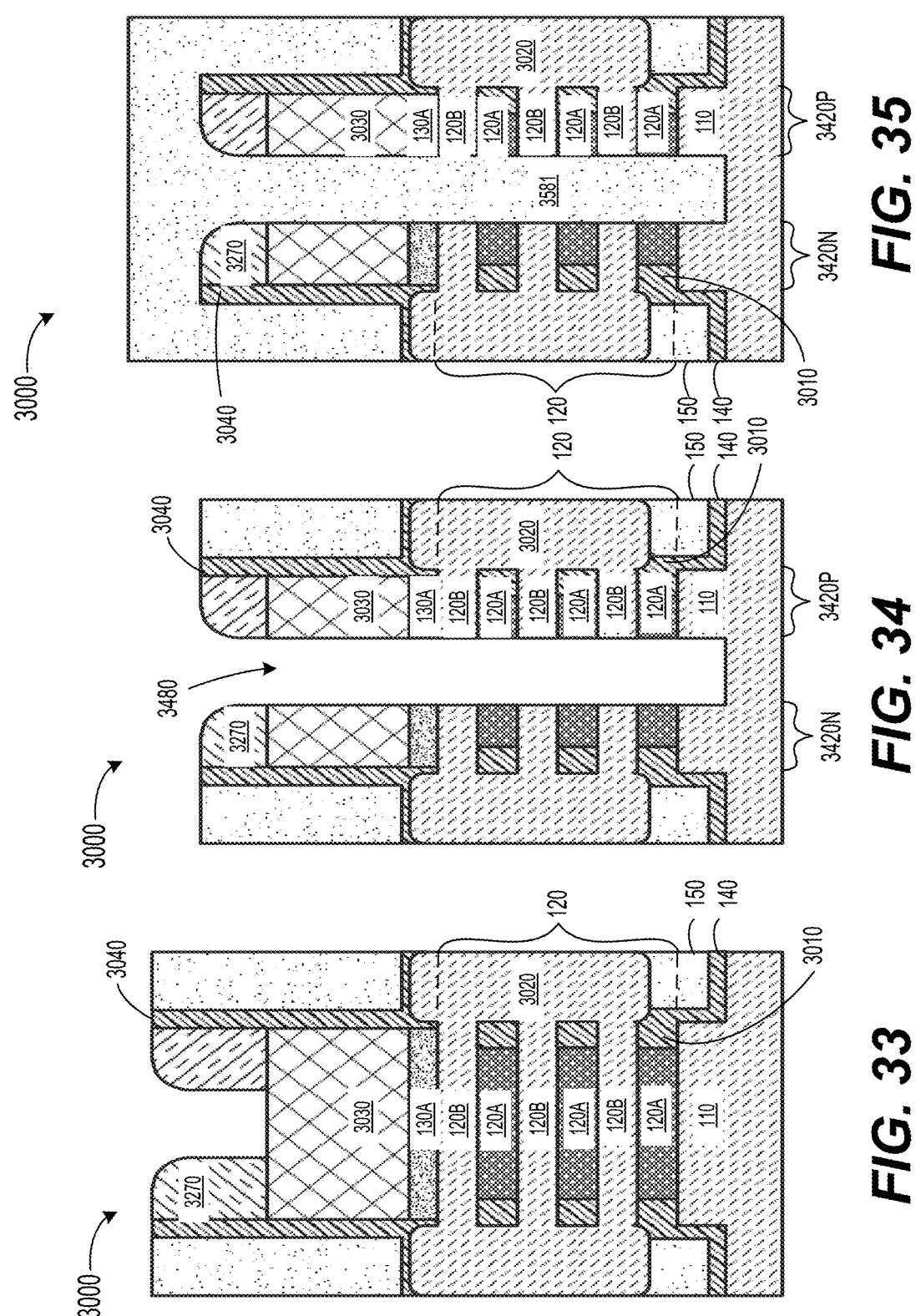

As shown in FIG. 34, the multi-layer stack 120 (and the partially recessed dummy gate material 3030) of the mandrel structure 190 can be directionally etched to define an insulation wall trench 3480 using the sidewall spacers 3270 as an etch mask to separate the multi-layer stack 120 of the mandrel structure 190 into a first multi-layer stack 3420N and a second multi-layer stack 3420P that are separated by the insulation wall trench 3480.

As shown in FIG. 35, an insulating material can be formed within the insulation wall trench 3480 (shown in FIG. 34) to form an insulation wall 3581 that insulates the first multi-layer stack 3420N and the second multi-layer stack 3420P from each other.

Figures 36, 37, 38:
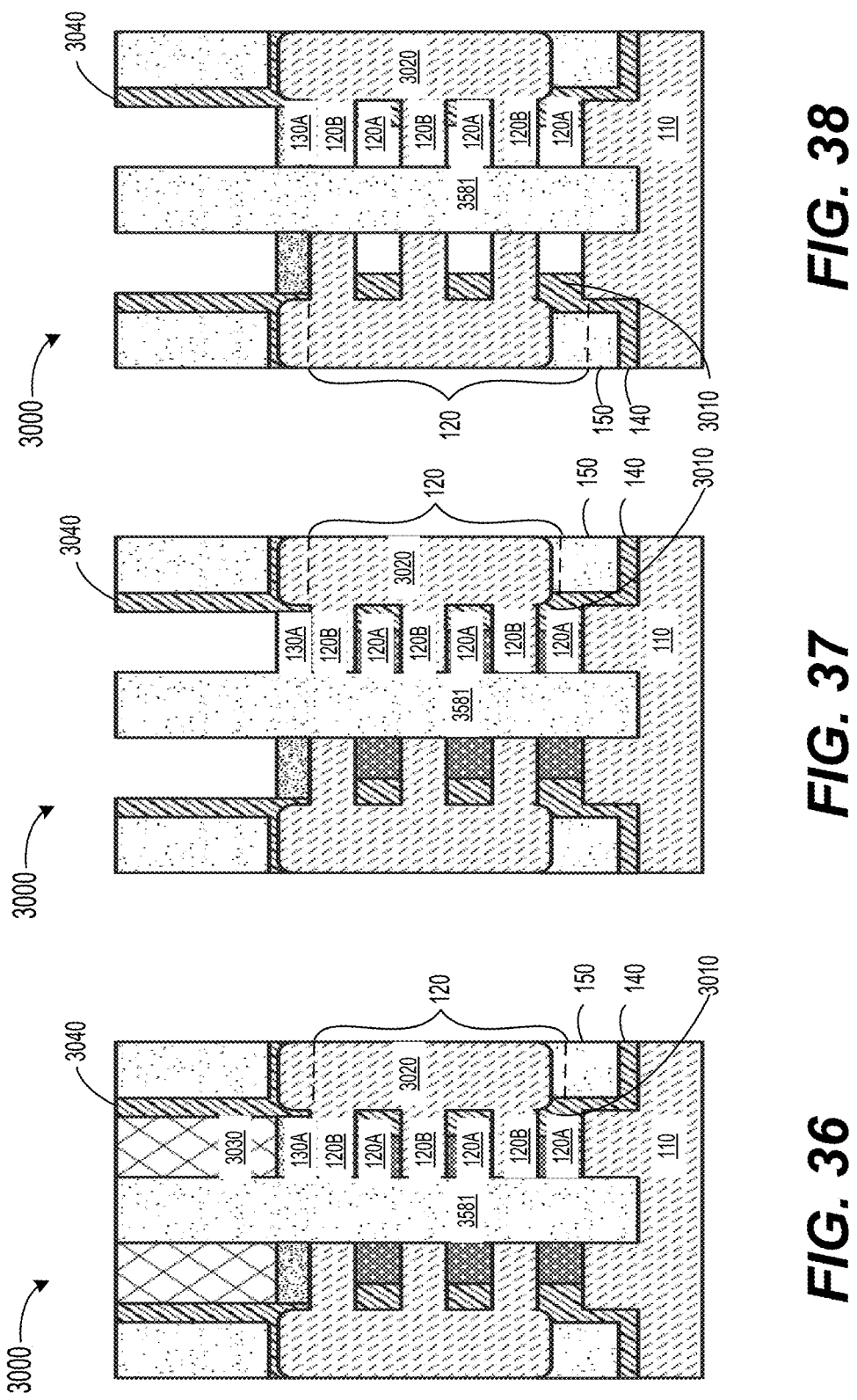

As shown in FIG. 36, the insulation material, the liner layer 3040 and the sidewall spacers 3270 are etched and removed to uncover the partially recessed dummy gate material 3030.

As shown in FIGS. 37 and 38, the dummy gate material 3030 and the second semiconductor layers 120B are removed and replaced with a gate structure, which may include a gate dielectric layer and a gate electrode formed on the gate dielectric layer.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. A method, comprising:
   forming a multi-layer stack on a substrate for a forksheet semiconductor structure, the multi-layer stack including first semiconductor layers and second semiconductor layers that are stacked over one another alternately;
   forming a cap layer over the multi-layer stack;
   forming a mandrel structure from the multi-layer stack and the cap layer;
   forming a fill material that surrounds the mandrel structure and has a top surface level with a top of the mandrel structure so that the cap layer of the mandrel structure is uncovered;
   partially recessing the cap layer of the mandrel structure relative to the top surface of the fill material to uncover opposite inner sidewalls of the fill material;
   forming first sidewall spacers on the uncovered opposite inner sidewalls of the fill material;
   directionally etching the multi-layer stack of the mandrel structure to define an insulation wall trench using the first sidewall spacers as an etch mask to separate the multi-layer stack of the mandrel structure into a first multi-layer stack and a second multi-layer stack that are separated by the insulation wall trench; and
   forming an insulation material within the insulation wall trench to form an insulation wall that insulates the first multi-layer stack and the second multi-layer stack from each other,
   wherein the cap layer includes a first cap layer and a second cap layer formed over the first cap layer, the first cap layer includes a first one of silicon oxide and silicon nitride, and the second cap layer includes a second one of the silicon oxide and the silicon nitride.

2. The method of claim 1, wherein the first cap layer is a first hardmask layer, and the second cap layer is a second hardmask layer.

3. The method of claim 2, wherein partially recessing the cap layer includes removing the second hardmask layer while leaving the first hardmask layer over the multi-layer stack of the mandrel structure.

4. The method of claim 1, wherein forming the first sidewall spacers includes a selective deposition of a spacer material that is deposited on the uncovered opposite inner sidewalls of the fill material.

5. The method of claim 4, wherein the selective deposition includes atomic layer deposition (ALD) of titanium nitride (TiN) on the uncovered opposite inner sidewalls of the fill material.

6. The method of claim 5, wherein the fill material contains carbon.

7. The method of claim 1, further comprising:

forming second sidewall spacers each on a corresponding one of the first sidewall spacers such that both the first sidewall spacers and the second sidewall spacers are used as the etch mask when directionally etching the multi-layer stack of the mandrel structure to define the insulation wall trench.

8. The method of claim 7, wherein the first sidewall spacers and the second sidewall spacers are formed by:

conformally depositing a first spacer material on the partially recessed cap layer and the top surface and the inner sidewalls of the fill material;

conformally depositing a second spacer material on the first spacer material;

directionally etching the second spacer material until uncovering the first spacer material; and directionally etching the first spacer material until uncovering the partially recessed cap layer.

9. The method of claim 7, wherein the first sidewall spacers and the second sidewall spacers are formed by:

conformally depositing a first spacer material on the partially recessed cap layer and the top surface and the inner sidewalls of the fill material;

directionally etching a portion of the first spacer material until uncovering the partially recessed cap layer;

conformally depositing a second spacer material on the first spacer material and the partially recessed cap layer; and directionally etching the second spacer material until uncovering the partially recessed cap layer.

10. The method of claim 1, wherein the first sidewall spacers are formed by:

conformally depositing a spacer material on the partially recessed cap layer and the top surface and the inner sidewalls of the fill material; and directionally etching and removing a portion of the spacer material that is deposited on the partially recessed cap layer and the top surface of the fill material.

11. The method of claim 10, further comprising:

forming a filler over the spacer material;

forming a hardmask over the filler;

patterning the hardmask to define an opening corresponding to a portion of the first sidewall spacers that is deposited over the partially recessed cap layer; and directionally etching and removing the filler via the hardmask.

12. The method of claim 1, further comprising:

removing the first sidewall spacers; and removing the cap layer.

13. The method of claim 12, wherein the insulation material is formed within the insulation wall trench before the cap layer and the first sidewall spacers are removed.

14. The method of claim 12, wherein the insulation material is formed within the insulation wall trench after the first sidewall spacers are removed and before the cap layer is removed.

15. A method, comprising:

forming a multi-layer stack on a substrate for a forksheet semiconductor structure, the multi-layer stack including first semiconductor layers and second semiconductor layers that are stacked over one another alternately;

forming a cap layer over the multi-layer stack;

forming a mandrel structure from the multi-layer stack and the cap layer;

forming a fill material that surrounds the mandrel structure and has a top surface level with a top of the mandrel structure so that the cap layer of the mandrel structure is uncovered;

partially recessing the cap layer of the mandrel structure relative to the top surface of the fill material to uncover opposite inner sidewalls of the fill material;

forming first sidewall spacers on the uncovered opposite inner sidewalls of the fill material;

directionally etching the multi-layer stack of the mandrel structure to define an insulation wall trench using the first sidewall spacers as an etch mask to separate the multi-layer stack of the mandrel structure into a first multi-layer stack and a second multi-layer stack that are separated by the insulation wall trench;

forming an insulation material within the insulation wall trench to form an insulation wall that insulates the first multi-layer stack and the second multi-layer stack from each other;

removing the first sidewall spacers; and removing the cap layer, wherein the insulation material is formed within the insulation wall trench after the cap layer and the first sidewall spacers are removed.

16. The method of claim 1, further comprising:

recessing the first semiconductor layers of the multi-layer stack so that sidewalls of the first semiconductor layers of the multi-layer stack are recessed; and forming inner spacers on the recessed sidewalls of the first semiconductor layers of the multi-layer stack.

17. The method of claim 1, further comprising:

recessing the first semiconductor layers of the first and second multi-layer stacks so that sidewalls of the first semiconductor layers of the first and second multi-layer stacks are recessed; and forming inner spacers on the recessed sidewalls of the first semiconductor layers of the first and second multi-layer stacks.

* * * * *